United States Patent [19]

Dumoulin

[11] Patent Number: 5,214,380
[45] Date of Patent: May 25, 1993

[54] VELOCITY-RESOLVED NMR SPECTROSCOPY

[75] Inventor: Charles L. Dumoulin, Ballston Lake, N.Y.

[73] Assignee: General Electric Company, Schenectady, N.Y.

[21] Appl. No.: 767,584

[22] Filed: Sep. 30, 1991

[51] Int. Cl.$^5$ .......................................... G01R 33/20
[52] U.S. Cl. ..................................... 324/307; 324/300
[58] Field of Search ............... 324/300, 306, 307, 309, 324/310, 311, 312, 313, 314, 318, 322; 128/653.2, 653.5

[56] References Cited

U.S. PATENT DOCUMENTS

| | | | |
|---|---|---|---|
| 4,609,872 | 9/1986 | O'Donnell | 324/306 |
| 4,680,546 | 7/1987 | Dumoulin | 324/307 |
| 4,978,918 | 12/1990 | Sakamoto | 324/309 |

OTHER PUBLICATIONS

J. K. M. Sanders and B. K. Hunter. Modern NMR Spectroscopy. Oxford University Press, 1987. Oxford, England; New York, N.Y.; Tokyo, Japan. Title page: Table of Contents; Chapt. 1.1—pp. 9-10; Chapt. 1.2—pp. 10-23; Chapt. 1.4—pp. 32-49; Chapt. 6.2—pp. 165-178.
Charles L. Dumoulin, Christopher J. Hardy, Steven P. Souza, Stephen A. Ash. U.S. Patent Application "Quantitative Measurement of Blood Flow Using Cylindrically Localized Fourier Velocity", Ser. No. 07/6451,872, filed Mar. 13, 1991.

Primary Examiner—Michael J. Tokar
Attorney, Agent, or Firm—Lawrence P. Zale; Marvin Snyder

[57] ABSTRACT

NMR spectroscopy employing flow-encoding magnetic field gradient pulses provide velocity sensitivity. Spectroscopic analysis of constituents of a sample can be obtained and separated by velocity. Fluid samples to be analyzed are passed through a chromatography column in order to cause different constituents of the sample to pass at different velocities. The sample is then subjected to a velocity sensitive NMR encoding sequence. Data is acquired from the sample which allows a spectroscopic analysis of a constituent of the sample. Signals from molecules of a constituent travelling at a desired velocity can be selectively detected, thereby providing information concerning the molecular weight of the detected molecule. NMR spectra of a mixture of molecules having differing molecular weights and absorption properties can be resolved into their individual constituents. The velocity sensitive NMR encoding and data acquisition may also be employed to determine the chemical composition of a fluid such as blood moving through a living organism.

17 Claims, 12 Drawing Sheets

VELOCITY-RESOLVED NMR SPECTROSCOPY

BACKGROUND OF THE INVENTION

1. Field of the Invention

This invention relates to Nuclear Magnetic Resonance (NMR) spectroscopy of a sample and more particularly NMR spectroscopy of constituents of a fluid sample moving at a predetermined velocities.

2. Description of Related Art

NMR spectroscopy procedures are used routinely to determine molecular structure, analyze mixtures and quantify concentrations of substances in a sample. Modern NMR methods provide information about a sample by the direct or indirect detection of one or more intrinsic parameters as described in *Modern NMR Spectroscopy* by J. K. M Sanders, and B. K. Hunter, Chapters 1.1, 1.2, 1.4 and 6.2 Oxford Univ. Press 1987 Oxford, England, New York, N.Y., Tokyo, Japan, hereby incorporated by reference. Among these parameters are: 1) chemical shift which arises from the local magnetic fields surrounding the nuclear spin caused by electronic bonds which connect the atoms within the molecule, 2) spin-spin coupling which arises from interactions of non-equivalent nuclear spins, 3) spin-lattice relaxation of longitudinal spin magnetization which is typically dominated by molecular motion within the main magnetic field, 4) spin-spin relaxation which manifests itself as an non-reversible loss of transverse spin coherence arising from the interaction of nuclear spins in non-equivalent spin states, 5) Nuclear-Overhauser effects which cause changes in longitudinal spin magnetization through interactions of spins having different gyromagnetic ratios, and 6) Multiple quantum effects arising from the concerted flipping of more than one spin in a system of coupled spins.

Although spin-spin interactions and spin-lattice interactions are influenced by the rate of molecular tumbling, and thus are somewhat sensitive to molecular weight, the use of these intrinsic parameters for qualitative molecular weight determination is rare, particularly when other intrinsic parameters are being measured.

Often it is desirable to use NMR methods to determine the components of a mixture. Mixtures of relatively small molecules can be readily analyzed with single dimension procedures provided that each component is unambiguously represented in some portion of the acquired data. Larger molecules having more complicated spectra, or mixtures of similar molecules, require NMR procedures which exploit additional intrinsic parameters. These procedures typically require the acquisition of data in two or more dimensions. Unfortunately, analysis of a mixture into its components is not guaranteed and separation of NMR spectra by an additional intrinsic parameter is frequently desirable.

SUMMARY OF THE INVENTION

An NMR procedure is made sensitive to molecular weight by the addition of magnetic field gradient pulses which induce phase shifts which are proportional to velocity. A fluid sample is passed over an absorbing medium within a sensitive region of an NMR instrument. This absorbing medium causes molecules of different molecular weights to move through the sensitive region at different velocities according to conventional chromatography. The amplitude and/or phase of the flow-encoding magnetic field gradient pulse is modulated during the procedure to selectively detect NMR signals from those nuclear spins traveling at a desired velocity, and thus from molecules having a desired molecular weight.

OBJECTS OF THE INVENTION

It is an object of the present invention to provide a method of obtaining spectroscopic information of a sample.

It is another object of the present invention to provide spectroscopic information relating to a sample passing through a chromatographic column.

It is another object of the present invention to selectively analyze molecules passing through a chromatography column at a predetermined velocity.

It is another object of the invention to provide a method by which the NMR spectrum of blood in a living organism can be selectively detected by non-invasive means.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIGS. 6b and 6c graphically illustrate the received spectra acquired after applying the pulse sequence of FIG. 6a.

FIG. 7b is a graphical illustration of received spectra acquired after applying the pulse sequence of FIG. 7a.

FIG. 8b is a graphical illustration of received spectra acquired after applying the pulse sequence of FIG. 8a.

DETAILED DESCRIPTION OF THE INVENTION

Figure 1:
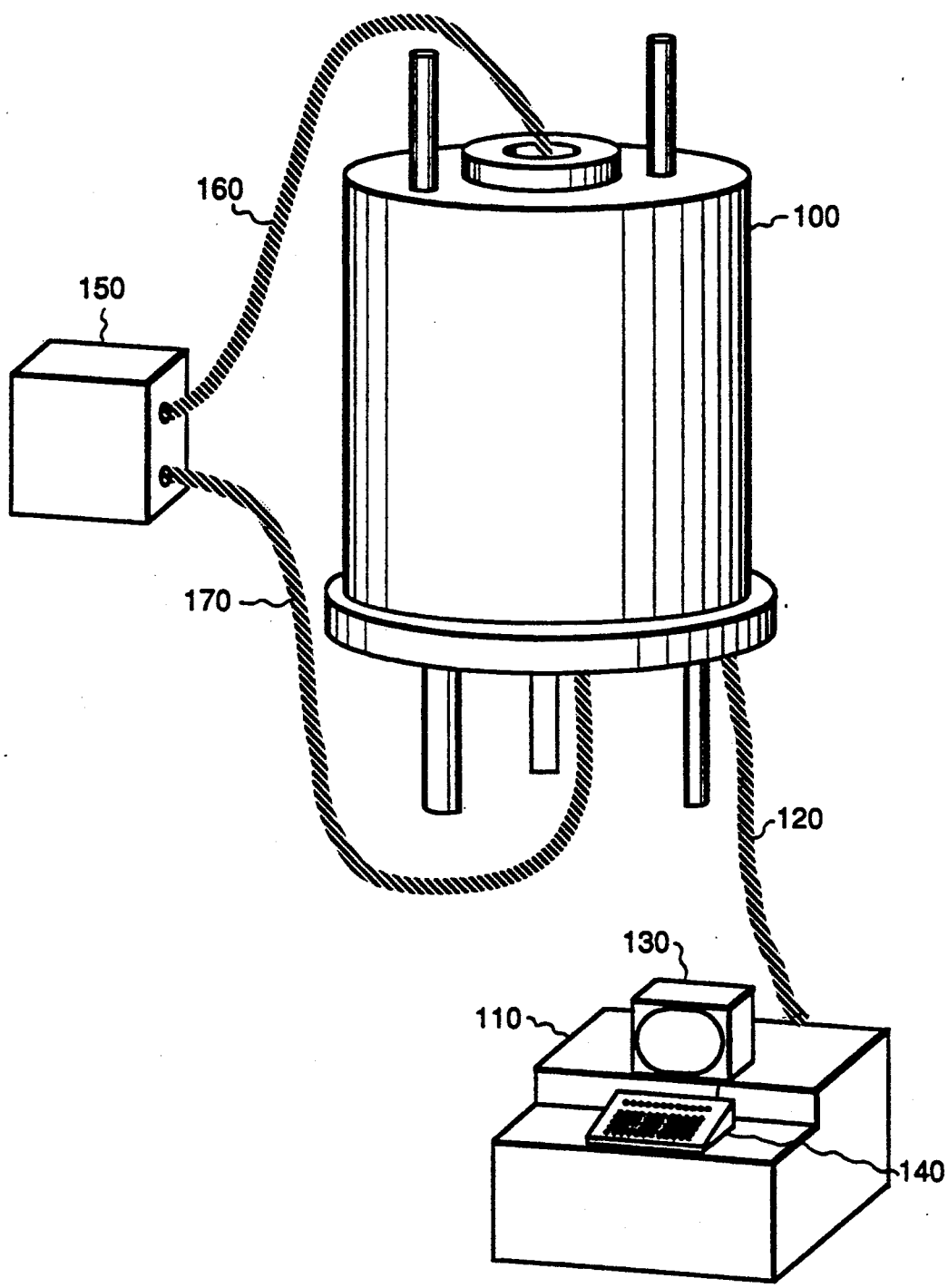
FIG. 1 is a perspective view of one embodiment of the present invention in operation acquiring velocity resolved NMR data from a selected sample.

FIG. 1 shows an NMR spectrometer system according to the present invention comprising a magnet 100, control subsystem 110, interface cables 120, display console 130 and keyboard 140. Magnet 100 creates a substantially uniform magnetic field over a selected volume. Control subsystem 110 includes means to create radio-frequency pulses and magnetic field gradients. The control subsystem also functions to detect evoked NMR signals generated by a fluid sample being either liquid or gaseous. The RF pulses, magnetic field gradients and detected signals are propagated through interface cables 120. The NMR spectrometer is controlled by the operator via keyboard 140. Acquired data is displayed on the display console 130.

In accordance with the invention, a pump means 150 causes a fluid sample to move at a velocity through the magnet from a hose 160, through a column (not shown) positioned within the magnet along its axis, and then through a second hose 170 back to pump means 150.

Figure 2:
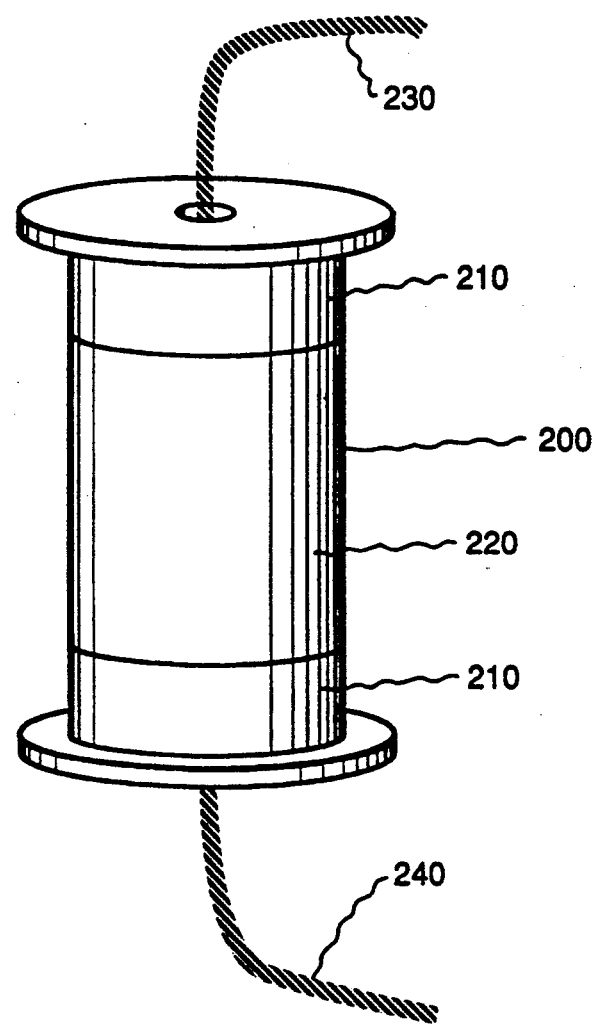
FIG. 2 is a perspective view of one embodiment of a sample column containing absorbing media used in the present invention.

In FIG. 2, a cylindrical column 200 is shown. This column is comprised of packing material 210 and absorbing media 220 constructed according to principles of conventional chromatography. A fluid sample is introduced at an end of column 200 via a hose 230 and exits via a hose 240. As the sample passes through absorbing media 220, molecules of any given constituent dissolved in the solvent are absorbed onto the media at a fixed rate and are then desorbed. The net effect is a bolus of dissolved molecules that passes through the column at a velocity less than that of the solvent. Since the absorption and desorption rates are functions of molecular weight and the physical interactions between the molecules and the absorbing media, each molecular species passes through the column at a unique rate. Thus, a mixture of different molecules in the fluid sample will be separated by their velocities, each constituent ideally containing a single molecular species. Each molecular species should ideally pass through absorbing media 220 at the same rate. In the present invention, however, the individual components of a mixture are not separated into a bolus as is typical in conventional chromatographic practice. Instead, the fluid sample containing the mixture is passed continuously through the absorbing media and the NMR spectra from each component is resolved according to its velocity in the column.

Figure 3A:
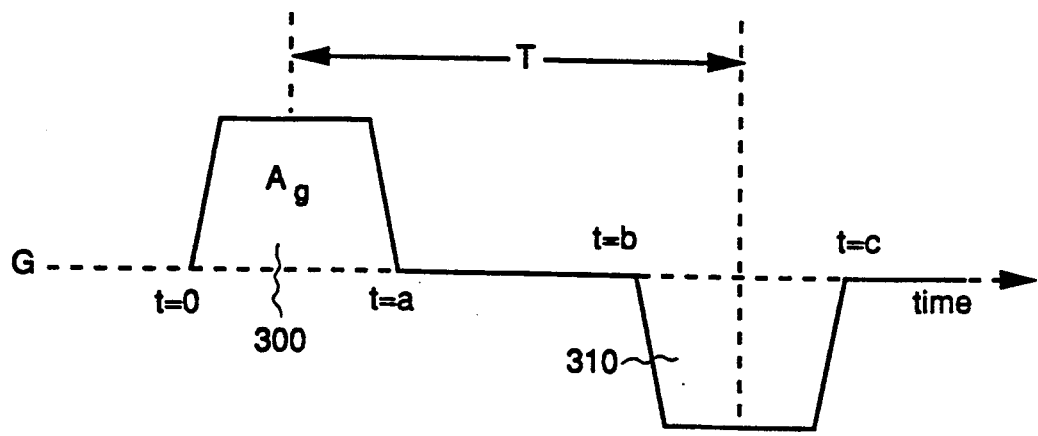
FIG. 3a is a graphical illustration of one embodiment of a flow-encoding magnetic field gradient pulse sequence according to the present invention, which is added to an NMR pulse sequence.
Figure 3B:
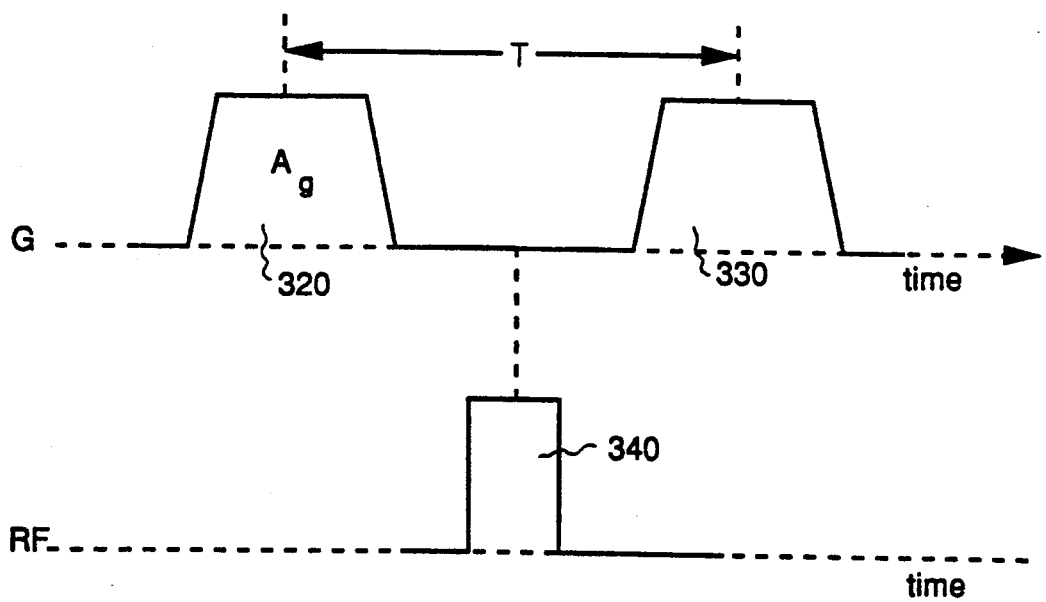
FIG. 3b is a graphical illustration of a second embodiment of a flow-encoding magnetic field gradient pulse sequence according to the present invention.

FIGS. 3a and 3b show two embodiments of flow-encoding magnetic field gradient pulse sequences. In FIG. 3a the magnetic field gradient has substantially zero intensity until time $t=0$. Beginning at $t=0$ and ending at $t=a$, a first magnetic field gradient pulse 300 is applied. Beginning at $t=b$ and ending at $t=c$ a second magnetic field gradient pulse 310 having substantially the same duration and intensity of the first gradient pulse, but having opposite polarity, is applied. The time interval between the two gradient pulses is T.

An alternative embodiment of this flow-encoding gradient pulse is shown in FIG. 3b. This embodiment is similar to the embodiment shown in FIG. 3a with the exception of the addition of a refocusing RF pulse 340 placed between the gradient waveforms 320, 330 and the second waveform 330 having a polarity identical to that of the first gradient pulse 320.

The application of magnetic field gradient pulse sequences such as those of FIGS. 3a and 3b results in a phase shift which is directly proportional to velocity, the area of each lobe of the pulse sequence being $A_g$, the gyromagnetic ratio of the nuclear species being $\gamma$ and the time interval between successive gradient lobes being T. This relationship is well known to those skilled in the art and can be expressed as:

$$\phi = \gamma V T A_g \qquad [1]$$

where $\phi$ is the flow-induced phase shift and V is the velocity component of the nuclear spin parallel to the applied magnetic field gradient.

Figure 4C:
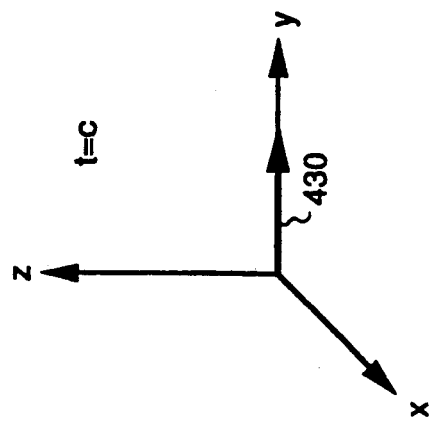
FIG. 4a–4c are vector illustrations of the effect of bipolar magnetic field gradient pulses on stationary spin magnetization.
Figure 4B:
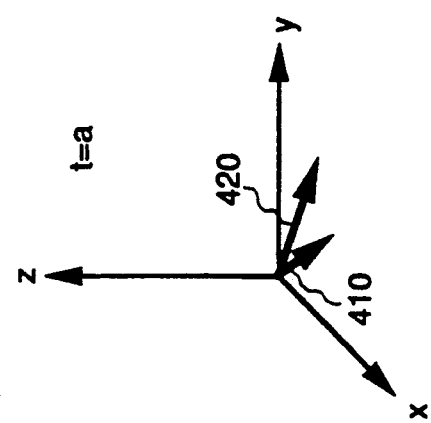
Figure 4A:
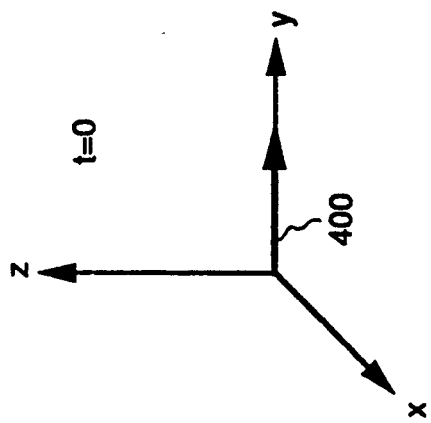

The effect of a flow-encoding magnetic field gradient pulse on a body of stationary spin magnetizations is shown in FIGS. 4a–4c. For the purpose of illustration, only vectors corresponding to the transverse magnetization of two spins at different positions in the direction of the applied flow-encoding gradient are shown. After the generation of transverse spin magnetization by an RF pulse, all the spins have the same phase and can be represented as a single vector 400 at time $t=0$, as shown in FIG. 4a. At time $t=a$, however, each spin has acquired a phase shift which is directly proportional to its position along the magnetic field gradient, as shown in FIG. 4b. These individual vectors 410, 420 arise from spins which do not change position and thus, when the second gradient pulse is applied the phase shifts generated by the first gradient pulse are exactly cancelled by the second gradient pulse. Consequently, the phase shift at time $t=c$, represented as a single vector 430, as shown in FIG. 4c, is substantially identical to the phase shift found at time $t=0$.

Figure 5C:
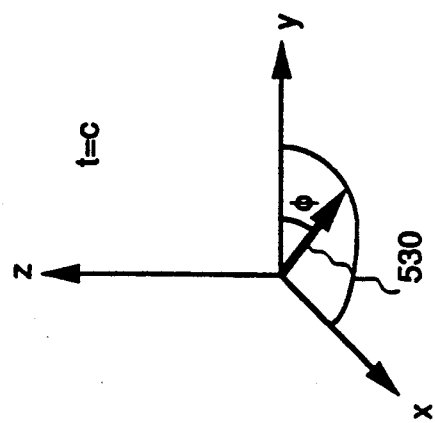
FIG. 5a–5c are vector illustrations of the effect of bipolar magnetic field gradient pulses on moving spin magnetization.
Figure 5B:
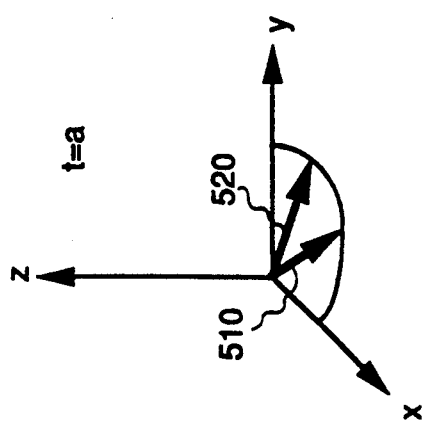
Figure 5A:
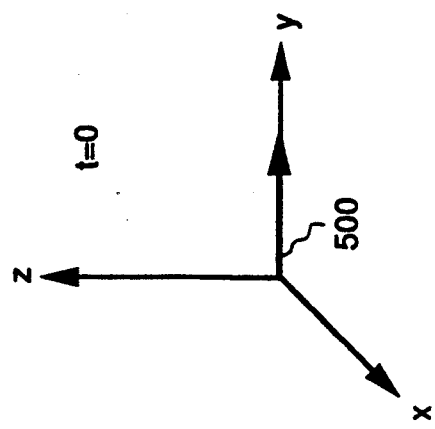

The effect of a flow-encoding magnetic field gradient pulse on a body of moving spin magnetization shown in FIGS. 5a–5c differs from that on a body of stationary spin magnetization shown in FIGS. 4a–4c. For the purpose of illustration, only vectors corresponding to the transverse spin magnetization of two spins traveling at the same velocity, but at different positions in the direction of the applied flow-encoding gradient, are illustrated. After the generation of transverse spin magnetization by an RF pulse, all the spins have the same phase and can be represented as a single vector 500 at time $t=0$, as shown in FIG. 5a. At time $t=a$, however, each spin has acquired a phase shift which is directly proportional to its position along the magnetic field gradient shown as vectors 510, 520 in FIG. 5b. These individual vectors arise from spins which change position with time and thus, when the second gradient pulse is applied, the phase shifts generated by the first pulse are not entirely cancelled by the second gradient pulse. Consequently, the phase shift at time $t=c$, represented as a single vector 530 as shown in FIG. 5c, differs from the phase shift found at time $t=0$ by an amount $\phi$. This phase shift is directly proportional to velocity V of equation 1.

Figure 6A:
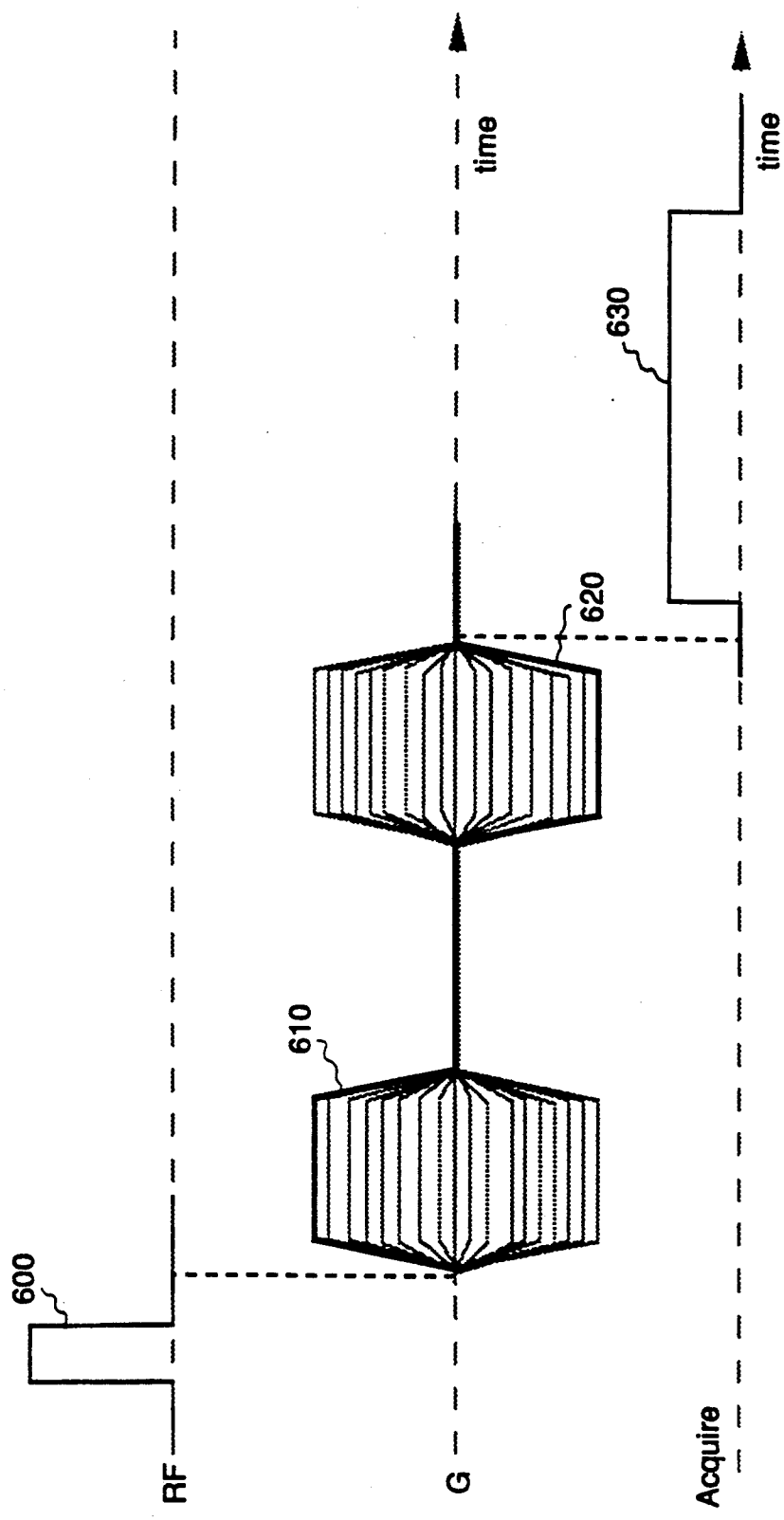
FIG. 6a is a graphical illustration of bipolar flow-encoding magnetic gradient pulses applied in a one-dimensional NMR spectroscopy procedure.

FIG. 6a shows a pulse sequence comprising an excitation RF pulse 600, a flow-encoding magnetic field gradient pulse having two lobes 610, 620, and a data acquisition period 630. N data points are acquired in the data acquisition period 630 responsive to RF pulse 600 and flow-encoding gradient pulse 610, 620. The signals which are digitized during the acquisition period evolve with a phase behavior which is dominated by the chemical shift of each nuclear spin. Thus, upon Fourier transformation of the N data points an NMR spectrum is obtained. This spectrum contains information from all chemical species in the sample.

The pulse sequence 600, 610, 620 and 630 of N data points is repeated M times with each repetition having different amplitude flow-encoding gradient lobes 610, 620 (show as dashed lines). The change in the gradient lobe amplitude is chosen to be substantially uniform for each repetition. The velocity induced phase shift $\phi$ of the detected signals is proportional to both spin's velocity V, and the amplitude of the gradient pulse $A_g$. The spin's velocity V remains substantially constant. Therefore, the signals acquired after each pulse sequence will have a phase shift which is dominated by the velocity V of each nuclear spin. Thus, Fourier transformation of the M data points at a selected value of N will result in a velocity spectrum. Since the Fourier transformations applied to obtain chemical shift and velocity spectra are applied to orthogonal vectors of an N×M array, the order of transformation of each vector does not matter.

Figure 6B:
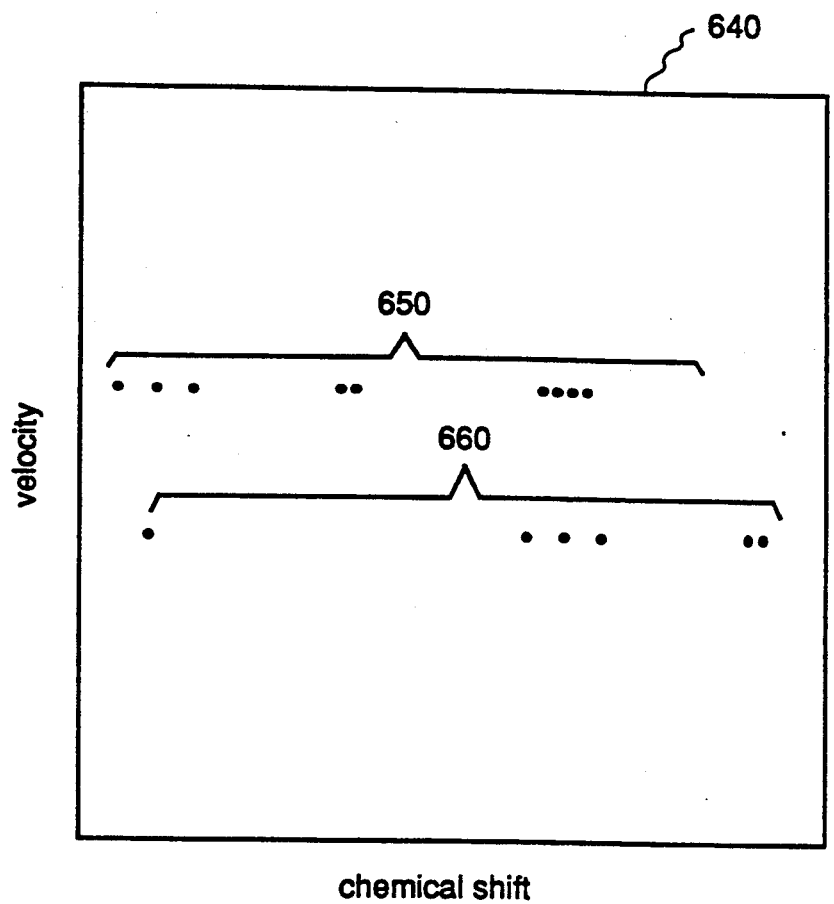
Figure 6C:
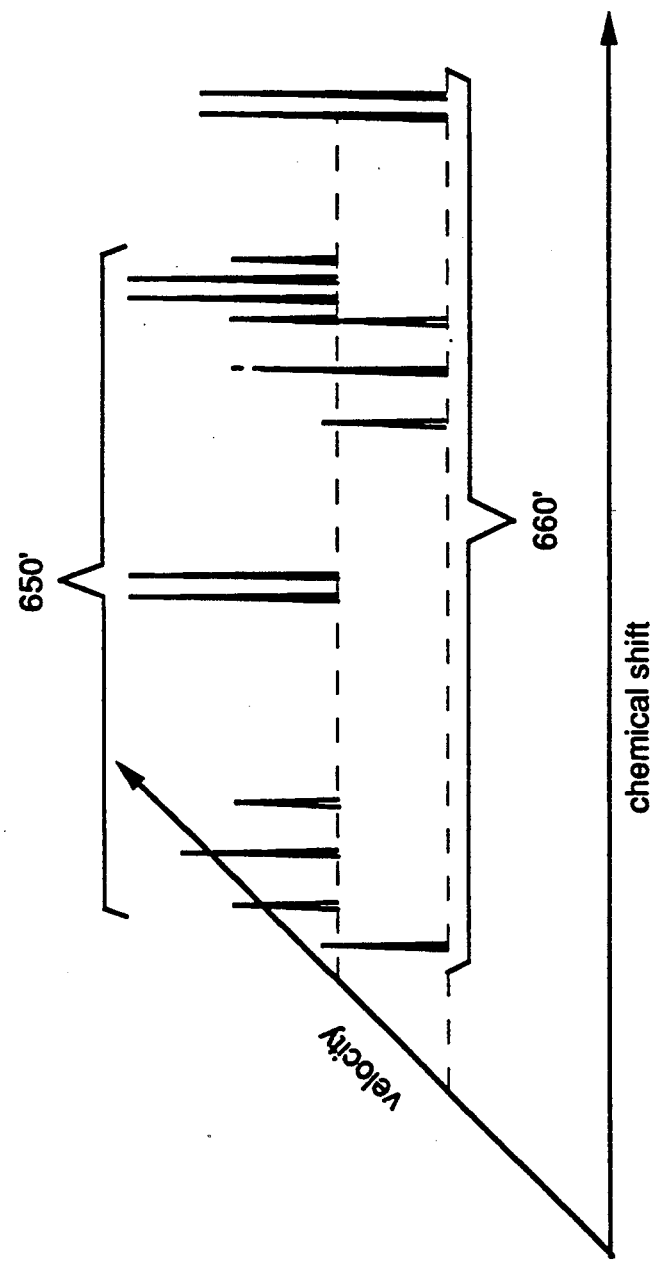

A schematic representation of an NMR data set resolved in both chemical shift and velocity is shown in FIGS. 6b and 6c. The data matrix 640 is a two-dimensional matrix obtained by Fourier transformation of the N×M matrix of acquired data in which the NMR spectra of two molecular species having differential chemical shift patterns and velocities are represented. One spectrum is represented in in contour format 650 in FIG. 6b and spectral format 650' in FIG. 6c. Likewise the second spectrum is represented in both contour format 660 and spectral format 660'.

It is useful to note that Fourier transformation is not the only means to resolve velocities. Hadamard or other demultiplexing schemes can also be employed. It is also useful to note that if M=2, moving spin magnetization can be distinguished from stationary spin magnetization by simply subtracting the first acquired vector of N data points from the second acquired vector of N data points. The resulting data set is a one-dimensional vector which contains information from only moving spins. Stationary spin information can be obtained by the summation of the two acquired vectors of N data points.

Figure 7A:
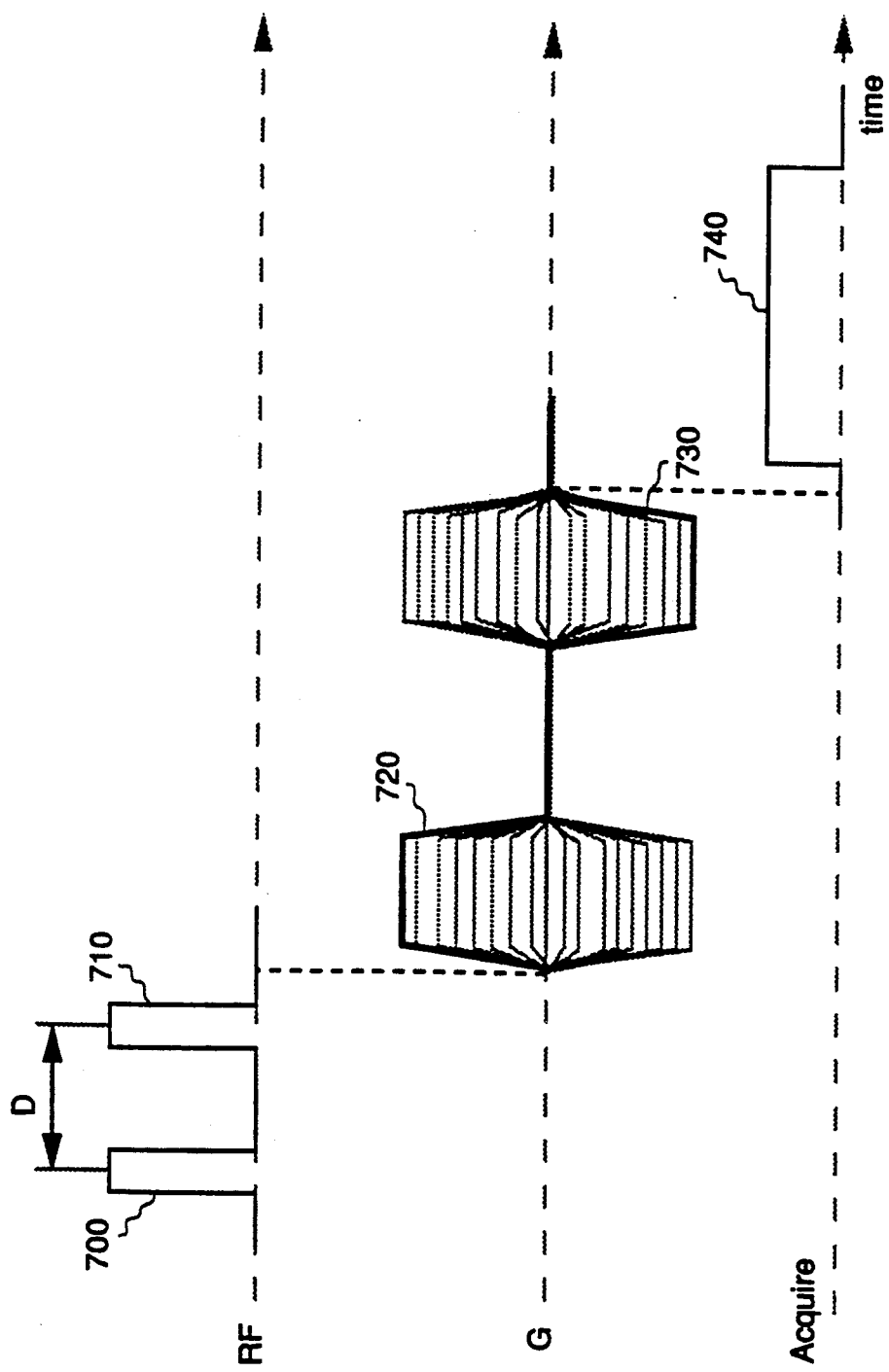
FIG. 7a is a graphical illustration of bipolar flow-encoding magnetic field gradient pulses applied in an NMR chemical shift correlation (COSY) procedure.
Figure 7B:
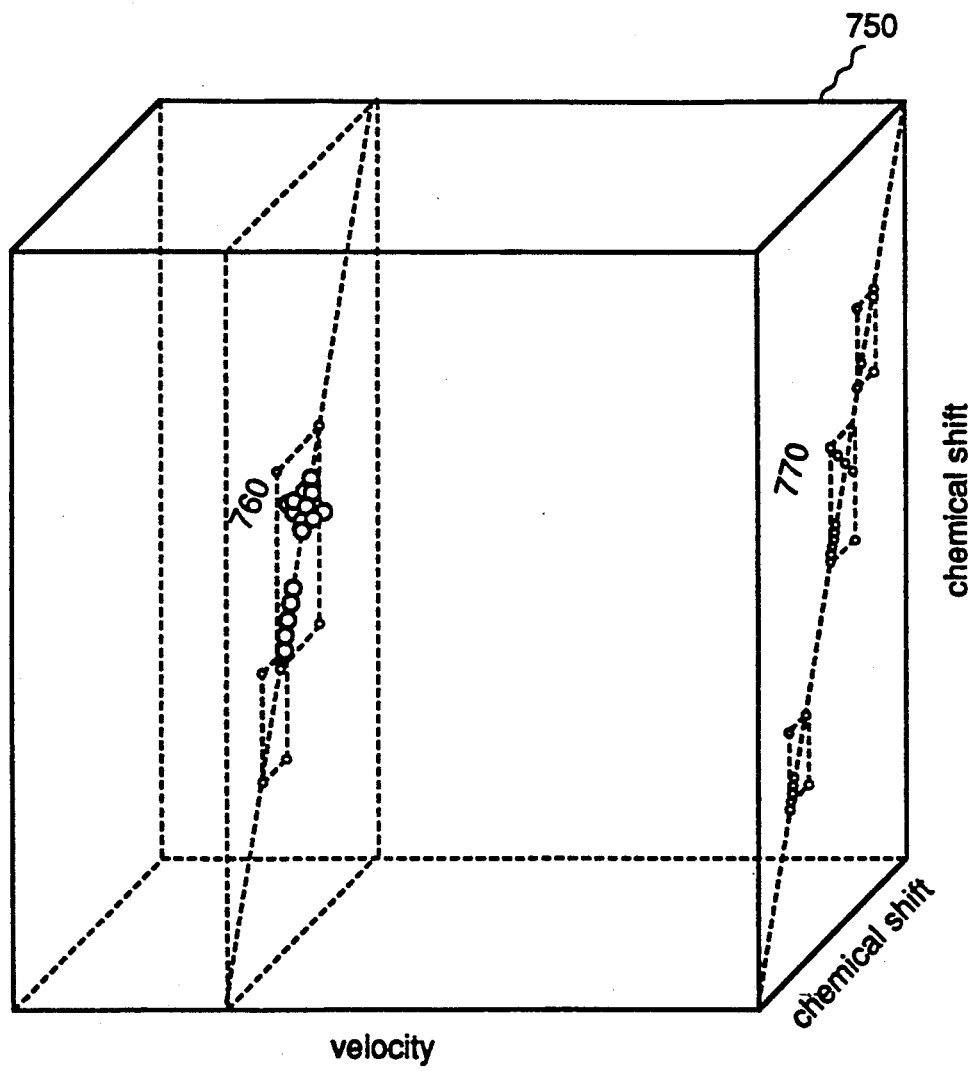

Turning now to FIGS. 7a and 7b, a second embodiment of the pulse sequence of the invention is shown. A pulse sequence comprising two excitation RF pulses, 700, 710, a flow-encoding magnetic field gradient pulse having two lobes 720, 730, and a data acquisition period 740, are shown in FIG. 7a.

As in the previously described embodiment, N data points are acquired in data acquisition period 740 and Fourier transformed to create a chemical shift dimension. A second chemical shift dimension is created by repeating the pulse sequence N' times wherein each repetition is performed with a different delay D which is incremented in a substantially uniform fashion. In the absence of flow-encoding gradient lobes, such a procedure is known as Chemical Shift Correlation Spectroscopy (COSY). The incorporation of flow-encoding gradient lobes 720, 730 provides a third dimension in which velocity is resolved in a fashion similar to that discussed previously for FIG. 6a. A schematic representation of a COSY NMR spectrum resolved in two chemical shift dimensions and one velocity dimension 750 is shown in FIG. 7b. This data set is created by the Fourier transformation of the acquired N×N'×M data matrix. Two-dimensional spectra are shown for a first molecular species traveling at one velocity 760 and a second molecular species traveling at a different velocity 770.

Figure 8A:
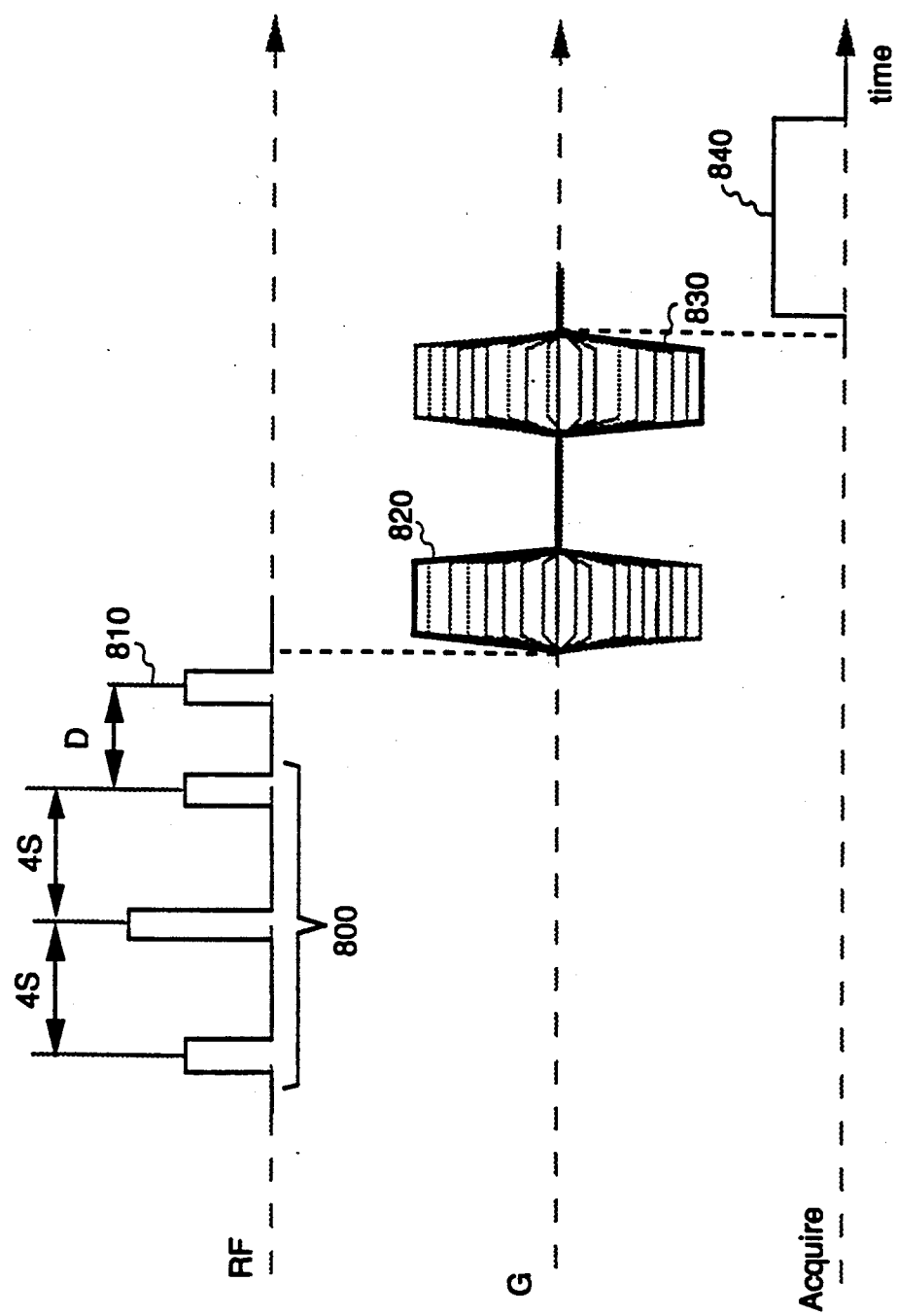
FIG. 8a is a graphical illustration of bipolar flow-encoding magnetic field gradient pulses applied in a multiple quantum NMR spectroscopy procedure.
Figure 8B:
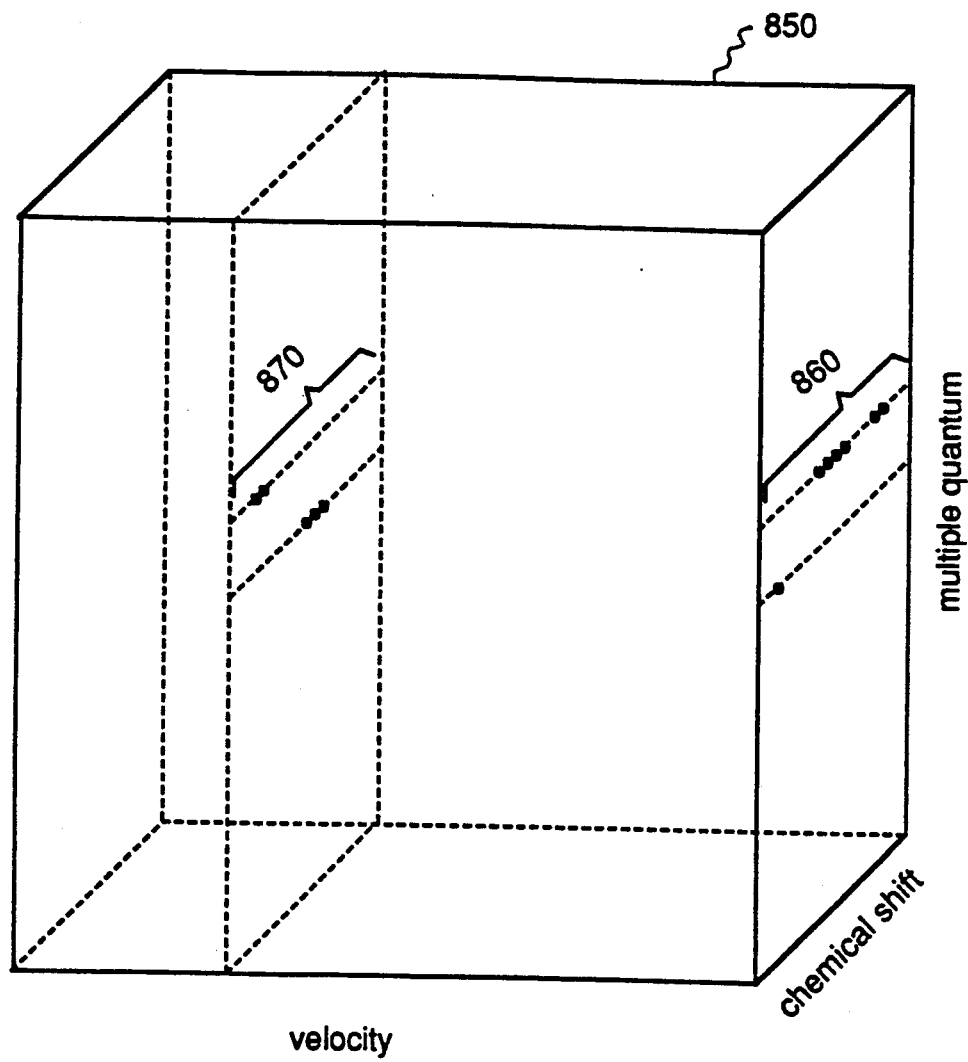

FIGS. 8a and 8b illustrate a third embodiment of the invention. A pulse sequence comprising a multiple-quantum excitation sub-sequence 800, a detection RF pulse 810, a flow-encoding magnetic field gradient pulse having lobes 820, 830, and a data acquisition period 840, are shown in FIG. 8a. As in the previously described embodiments, N data points are acquired in the data acquisition period 840 and Fourier transformed to create a chemical shift dimension. A second dimension is created by repeating the pulse sequence L times wherein each repetition is performed with a delay D which is incremented in a substantially uniform fashion. This delay D allows multiple quantum coherence created by the multiple quantum excitation sub-sequence 800 to evolve with a phase behavior determined by the spins multiple quantum frequency. A more detailed explanation is disclosed in U.S. Pat. No. 4,680,546 Methods Of, And Pulse Sequences For, The Suppression of Undesired Resonances By Generation of Quantum Coherence In NMR Imaging And Spectroscopy by Charles L. Dumoulin issued Jul. 14, 1987, assigned to the present assignee and incorporated by reference. In the absence of flow-encoding gradient lobes, such a procedure is known as two-dimensional multiple quantum spectroscopy. The incorporation of flow-encoding gradient lobes 820, 830 provides a third dimension in which velocity is resolved in a fashion similar to that discussed previously for FIGS. 6a and 7a. A schematic representation of a multiple quantum spectrum resolved in chemical shift, multiple quantum frequency and velocity 850 is shown in FIG. 8b. This data set is created by the Fourier-transformation of the acquired N×L×M data matrix.

The present invention can also be employed to selectively detect NMR spectra from fluid samples moving through or near stationary fluid samples. An example is the use of this invention to selectively acquire NMR spectra from blood moving within a living organism. In such an application the subject is placed within a magnet along its longitudinal axis and the direction of the applied magnetic field gradient is chosen to coincide with selected blood vessels. Cardiac synchronization can be employed to minimize artifacts arising from non-constant flow. Signal-to-noise ratios can be optimized by employing surface coils in a manner well known to those skilled in the art.

The present invention can also be used to obtain NMR spectra of chemical species moving at different velocities under the influence of an external electric field or field gradient. One example is the use of electrophoresis to cause molecules having different electronic charge-to-mass ratios to travel through the NMR sensitive volume at different velocities.

It is also important to note that the invention can be applied to other NMR spectroscopy procedures not described here, but incorporated in spirit. Furthermore, two-lobed flow-encoding gradient pulses are but one of a series of multi-lobed gradient pulses which can be used to induce phase shifts proportional to velocity acceleration, jerk and higher orders of motion as described in U.S. Patent application Quantitative Measurement of Blood Flow Using Cylindrically Localized Fourier Velocity by Charles L. Dumoulin, Christopher J. Hardy, Steven P. Souza, and Stephen A. Ash, Ser. No. 07/651,872, filed Mar. 13, 1991, assigned to the present assignee and hereby incorporated by reference.

While several presently preferred embodiments of velocity resolved NMR spectroscopy have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for performing velocity resolved NMR spectroscopy of a fluid sample comprising the steps of:
   a) passing said fluid sample through a substantially homogeneous magnetic field;
   b) generating magnetization of said fluid sample in a transverse plane by application of one or more RF pulses to said fluid sample;
   c) applying flow-encoding magnetic field gradient pulses to said fluid sample;
   d) acquiring chemical shift resolved NMR data from said fluid sample; and
   e) repeating steps a–d for a plurality of repetitions.

2. The method of claim 1, wherein the step of passing said fluid sample through a magnetic field comprises the step of passing said fluid sample through a chromatographic column immersed in a substantially homogeneous magnetic field in order to alter the velocity of a set of constituents in said sample and generate magnetization in the transverse plane.

3. The method of claim 2, wherein, in the step of acquiring NMR data, each spectrum is responsive to the application of a flow-encoding magnetic field gradient pulses having a different amplitude.

4. The method of claim 3, further comprising the step of applying a Fourier transformation to the acquired data so as to generate a velocity resolved spectrum.

5. The method of claim 3, further comprising the step of applying a Hadamard transformation to the acquired data so as to generate a velocity resolved spectrum.

6. The method of claim 3, wherein the step of generating magnetization further comprises the step of applying an RF pulse having a first and second lobe of the same polarity with the second lobe being applied a period D after the first lobe has been applied, in order to produce a Chemical Shift Correlation Spectroscopy (COSY) spectrum to be acquired, the period D having a different value for each repetition.

7. The method of claim 3, wherein the step of generating magnetization further comprises the step of applying a velocity resolved multiple-quantum excitation sequence and a detection RF pulse to the sample in order to produce a multiple-quantum spectrum to be acquired.

8. The method of claim 1, wherein, in the step of acquiring NMR data, each spectrum is responsive to the application of a flow-encoding magnetic field gradient pulses having a different amplitude.

9. The method of claim 8, further comprising the step of applying a Fourier transformation to the acquired data so as to generate a velocity resolved spectrum.

10. The method of claim 8, further comprising the step of applying a Hadamard transformation to the acquired data so as to generate a velocity resolved spectrum.

11. The method of claim 8, wherein the step of generating magnetization further comprises the step of applying an RF pulse having a first and second lobe of the same polarity with the second lobe being applied a period D after the first lobe has been applied, in order to produce a Chemical Shift Correlation Spectroscopy (COSY) spectrum to be acquired, the period D having a different value for each repetition.

12. The method of claim 8, wherein the step of generating magnetization further comprises the step of applying a velocity resolved multiple-quantum excitation sequence and a detection RF pulse to the sample in order to produce a multiple-quantum spectrum to be acquired.

13. The method of claim 1, wherein the step of applying flow-encoding magnetic field gradient pulses comprises applying a flow-encoding magnetic field gradient pulse having two sequential lobes of substantially equal durations and amplitudes but having opposite polarity.

14. The method of claim 1, wherein the step of applying flow-encoding magnetic field gradient pulses comprises applying a flow-encoding magnetic field gradient pulse having two sequential lobes of substantially equal durations and amplitudes and a refocussing RF pulse applied during the interval between gradient pulses.

15. The method of claim 1, wherein the step of applying flow-encoding magnetic field gradient pulses comprises applying a flow-encoding magnetic field gradient pulse having three or more lobes to provide sensitivity to higher orders of motion.

16. The method of claim 1, wherein the step of passing said fluid sample through a magnetic field comprises the step of subjecting said fluid sample to an electric field thereby causing molecular motion of said fluid sample.

17. The method of claim 1, wherein the step of passing said fluid sample through a magnetic field comprises placing a living organism having internal fluid motion in the magnetic field.

* * * * *